(12) United States Patent
Oshima et al.

(10) Patent No.: US 11,028,277 B2
(45) Date of Patent: Jun. 8, 2021

(54) CHARGE TRANSPORT VARNISH

(71) Applicant: NISSAN CHEMICAL CORPORATION, Tokyo (JP)

(72) Inventors: Juro Oshima, Funabashi (JP); Takuji Yoshimoto, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 125 days.

(21) Appl. No.: 16/074,991

(22) PCT Filed: Jan. 25, 2017

(86) PCT No.: PCT/JP2017/002511
§ 371 (c)(1),
(2) Date: Aug. 2, 2018

(87) PCT Pub. No.: WO2017/135117
PCT Pub. Date: Aug. 10, 2017

(65) Prior Publication Data
US 2019/0062572 A1    Feb. 28, 2019

(30) Foreign Application Priority Data
Feb. 3, 2016   (JP) ............................ JP2016-018989

(51) Int. Cl.
| C09D 5/24 | (2006.01) |
| C09D 11/52 | (2014.01) |
| H01L 51/42 | (2006.01) |
| H01L 51/46 | (2006.01) |
| H01L 51/44 | (2006.01) |
| H01L 51/54 | (2006.01) |
| H01B 1/12 | (2006.01) |
| H01L 51/00 | (2006.01) |
| H01L 51/50 | (2006.01) |

(52) U.S. Cl.
CPC ............... *C09D 5/24* (2013.01); *C09D 11/52* (2013.01); *H01B 1/127* (2013.01); *H01B 1/128* (2013.01); *H01L 51/0007* (2013.01); *H01L 51/0036* (2013.01); *H01L 51/0047* (2013.01); *H01L 51/424* (2013.01); *H01L 51/4253* (2013.01); *H01L 51/442* (2013.01); *H01L 51/506* (2013.01); *Y02E 10/549* (2013.01); *Y02P 70/50* (2015.11)

(58) Field of Classification Search
CPC ............... H01B 1/127; H01B 1/128; H01L 31/00–31/208; C01B 32/152
See application file for complete search history.

(56) References Cited

U.S. PATENT DOCUMENTS

| 2007/0043222 A1* | 2/2007 | Yoshimoto ........... C07D 339/06 549/15 |
| 2008/0319207 A1* | 12/2008 | Laird .................. H01G 9/2004 549/29 |
| 2009/0269688 A1 | 10/2009 | Yoshimoto et al. |
| 2009/0314350 A1 | 12/2009 | Jung et al. |
| 2016/0163465 A1 | 6/2016 | Morioka |
| 2018/0175298 A1* | 6/2018 | Sassa .................... H01L 29/786 |

FOREIGN PATENT DOCUMENTS

| DE | 10 2007 038 906 A1 | 4/2009 |
| EP | 0 497 379 A1 | 8/1992 |
| EP | 1 785 413 A1 | 5/2007 |
| JP | 2010-123930 A | 6/2010 |
| WO | WO 90/01775 A1 | 2/1990 |
| WO | WO 2006/085574 A1 | 8/2006 |
| WO | WO 2008/010474 A1 | 1/2008 |
| WO | WO 2010/058777 A1 | 5/2010 |
| WO | WO 2015/029344 A1 | 3/2015 |

OTHER PUBLICATIONS

International Search Report (PCT/ISA/210) issued in PCT/JP2017/002511, dated Feb. 21, 2017.
Li et al., "Polymer solar cells", Nature Photonics, Mar. 2012. vol. 6, pp. 153-161. www.nature.com/naturephotonics.
Lim et al., "Organic-on-silicon complementary metal-oxide-semiconductor colour image sensors", Scientific Reports, 2015, vol. 5, No. 7708, pp. 1-7.
O'Regan et al., "A low-cost, high-efficiency Solar cell based on dye-sensitized colloidal $TiO_2$ films", Nature, Oct. 24, 1991, vol. 353, pp. 737-740.
Tang, "Two-layer organic photovoltaic cell", Appl. Phys. Lett., Jan. 1986, vol. 48, No. 2, pp. 183-185.
Written Opinion (PCT/ISA/237) issued in PCT/JP2017/002511, dated Feb. 21, 2017.
Supplementary European Search Report dated Jan. 7, 2019, in European Patent Application No. 17747276.8.

* cited by examiner

*Primary Examiner* — Ramsey Zacharia
(74) *Attorney, Agent, or Firm* — Birch, Stewart, Kolasch & Birch, LLP

(57) ABSTRACT

A charge transport varnish containing a charge transport substance, an electron-accepting dopant substance, and an organic solvent, wherein the electron-accepting dopant substance contains one or more types selected from naphthalene disulfonic acid, naphthalene trisulfonic acid, and naphthalene tetrasulfonic acid. This charge transport varnish is suitable for forming a hole collection layer that can be used to produce an organic photoelectric conversion element which exhibits high photoelectric conversion efficiency.

14 Claims, No Drawings

CHARGE TRANSPORT VARNISH

TECHNICAL FIELD

The present invention relates to a charge-transporting varnish.

BACKGROUND ART

Organic solar cells are solar cell devices that use organic compounds in the active layer and the charge-transporting substance. The dye-sensitized solar cells developed by M. Grätzel and the organic thin-film solar cells developed by C. W. Tang are well known (Non-Patent Documents 1 and 2).

Because both have characteristics differing from those of the inorganic solar cells currently in mainstream use, including the fact that they are thin, lightweight films which can be made flexible, and the fact that roll-to-roll production is possible, they are expected to lead to the creation of new markets.

Of these, organic thin-film solar cells have attracted considerable attention in part because, in addition to having such characteristics as being electrolyte-free and heavy metal compound-free, they have recently been reported by a group at UCLA et al. as having a photoelectric conversion efficiency (abbreviated below as "PCE") of 10.6% (Non-Patent Document 3).

Also, given that organic thin-film solar cells, compared with existing photoelectric conversion devices that use silicon-based materials, have certain characteristics, such as exhibiting a high photoelectric conversion efficiency even under low illumination, which makes thinner devices and smaller pixels possible and are capable also of having the attributes of a color filter, they are noteworthy not only in solar cell applications, but also in organic CMOS image sensor and other photosensor applications (Non-Patent Document 4). A description is given below of organic thin-film solar cells, which are generally referred to as organic photoelectric conversion devices (sometimes abbreviated below as OPVs).

Organic photoelectric conversion devices are constructed of, for example, an active layer (photoelectric conversion layer), charge (hole, electron) collecting layers and electrodes (anode, cathode).

Of these, the active layer and the charge-collecting layers are generally formed by vacuum deposition processes. However, vacuum deposition has drawbacks in terms of, for example, its complexity as a mass production process, the high cost of the equipment, and the efficiency of material utilization.

In light of these drawbacks, water-dispersible polymeric organic conductive materials such as PEDOT/PSS are sometimes used as coating-type materials for forming hole-collecting layers. However, because these are aqueous dispersions, complete removal of the water and moisture reabsorption control are difficult, which tends to accelerate device deterioration.

Moreover, there remain a variety of challenges facing the use of aqueous dispersions of PEDOT/PSS in mass production. Namely, such dispersions are prone to solids agglomeration, and so defects readily arise in applied films made thereof and the coating equipment has a tendency to clog or corrode. In addition, the applied films leave something to be desired in terms of heat resistance.

PRIOR ART DOCUMENTS

Non-Patent Documents

Non-Patent Document 1: Nature, Vol. 353, 737-740 (1991)
Non-Patent Document 2: Appl. Phys. Lett., Vol. 48, 183-185 (1986)
Non-Patent Document 3: Nature Photonics, Vol. 6, 153-161 (2012)
Non-Patent Document 4: Scientific Reports, Vol. 5: 7708, 1-7 (2015)

SUMMARY OF INVENTION

Technical Problem

The present invention was arrived at in light of the above circumstances. An object of the invention is to provide a charge-transporting varnish suitable for forming a hole-collecting layer that gives an organic photoelectric conversion device having a high photoelectric conversion efficiency.

Solution to Problem

In the course of extensive investigations aimed at achieving the above object, the inventors have discovered that by using, as the hole-collecting layer of an organic photoelectric conversion device, a thin film produced from a charge-transporting varnish containing a charge-transporting substance, an electron-accepting dopant substance which is includes a naphthalenepolysulfonic acid such as naphthalenedisulfonic acid, and an organic solvent, a high photoelectric conversion efficiency can be achieved.

Accordingly, the invention provides:
1. A charge-transporting varnish comprising a charge-transporting substance, an electron-accepting dopant substance and an organic solvent, wherein the electron-accepting dopant substance includes at least one compound selected from the group consisting of naphthalenedisulfonic acids, naphthalenetrisulfonic acids and naphthalenetetrasulfonic acids;
2. The charge-transporting varnish of 1 above, wherein the electron-accepting dopant substance includes at least one compound selected from the group consisting of naphthalenedisulfonic acids and naphthalenetrisulfonic acids;
3. The charge-transporting varnish of 1 or 2 above, wherein the charge-transporting substance is a charge-transporting substance having a molecular weight of from 200 to 2,000;
4. The charge-transporting varnish of any of 1 to 3 above, wherein the charge-transporting substance is at least one compound selected from the group consisting of aniline derivatives and thiophene derivatives;
5. The charge-transporting varnish of any of 1 to 4 above which is for use in forming a hole-collecting layer for an organic photoelectric conversion device;
6. The charge-transporting varnish of 5 above, wherein the organic photoelectric conversion device is an organic thin-film solar cell or a photosensor;

7. A charge-transporting thin film produced from the charge-transporting varnish of any of 1 to 6 above;
8. A hole-collecting layer produced from the charge-transporting varnish of 5 above;
9. An organic photoelectric conversion device comprising the hole-collecting layer of 8 above and an active layer provided so as to be in contact therewith;
10. The organic photoelectric conversion device of 9 above, wherein the active layer includes a fullerene derivative;
11. The organic photoelectric conversion device of 9 above, wherein the active layer includes a polymer having a thiophene skeleton on the main chain;
12. The organic photoelectric conversion device of 9 above, wherein the active layer includes a fullerene derivative and a polymer having a thiophene skeleton on the main chain;
13. The organic photoelectric conversion device of any of 9 to 12 above which is an organic thin-film solar cell; and
14. The organic photoelectric conversion device of any of 9 to 12 above which is a photosensor.

Advantageous Effects of Invention

By using a thin film produced from the charge-transporting varnish of the invention as the hole-collecting layer in an organic photoelectric conversion device, an organic photoelectric conversion device having a high photoelectric conversion efficiency can be obtained.

Also, because the charge-transporting varnish of the invention is a uniform organic solution, it is highly compatible with mass production processes. Moreover, because it exhibits a high uniform film formability while leveling the underlying anode having surface irregularities, a high device yield can be achieved, in addition to which current leakage can be suppressed and the reverse bias dark current can be minimized.

Furthermore, the organic photoelectric conversion device of the invention exhibits a high conversion efficiency for visible light, near-ultraviolet light and near-infrared light, independent of the intensity of the irradiated light, and also exhibits a high durability.

By virtue of these qualities, the organic photoelectric conversion device of the invention can be used as an organic thin-film solar cell in such applications as solar photovoltaic power generation and indoor photovoltaic power generation, and can also be suitably used in image sensors and other photosensor applications.

In addition, because the hole-collecting layer produced from the charge-transporting varnish of the invention exhibits a high heat resistance, it is able to withstand various high-temperature processes following film formation.

DESCRIPTION OF EMBODIMENTS

The invention is described below in greater detail.

The charge-transporting varnish according to this invention includes a charge-transporting substance, an electron-accepting dopant substance and an organic solvent. The electron-accepting dopant substance includes at least one naphthalenepolysulfonic acid selected from among naphthalenedisulfonic acids, naphthalenetrisulfonic acids and naphthalenetetrasulfonic acids.

In this invention, the molecular weight of the charge-transporting substance is not particularly limited. However, taking into account the electrical conductivity, the molecular weight is preferably from 200 to 2,000, with the lower limit being preferably at least 300, and more preferably at least 400. From the standpoint of increasing the solubility in solvents, the upper limit is preferably not more than 1,500, and more preferably not more than 1,000.

The charge-transporting substance may be suitably selected and used from among known charge-transporting substances. Aniline derivatives and thiophene derivatives are preferred, with aniline derivatives being especially preferred.

Illustrative examples of such aniline derivatives and thiophene derivatives include those disclosed in, for example, WO 2005/043962, WO 2013/042623 and WO 2014/141998.

Specific examples include aniline derivatives and thiophene derivatives of formulas (H1) to (H3) below.

[Chem. 1]

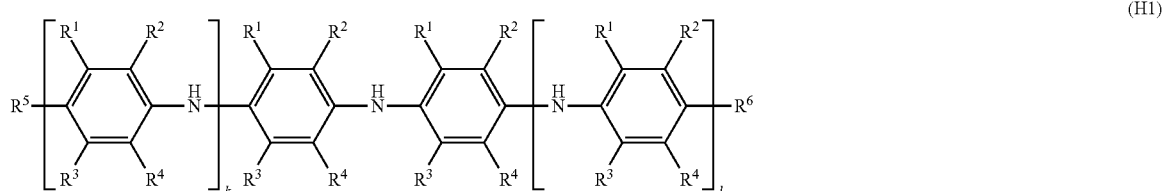

(H1)

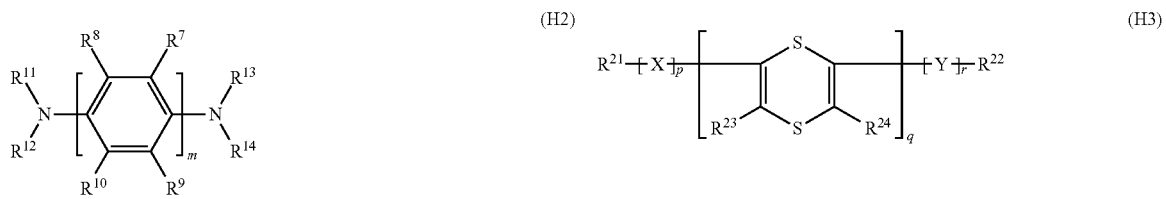

(H2) (H3)

The aniline derivatives of formula (H1) may be an oxidized aniline derivatives having within the molecule a quinonediimine structure of the following formula (quinonediimine derivative). Methods of oxidizing aniline derivatives to form quinonediimine derivatives are exemplified by the methods described in WO 2008/010474 and WO 2014/119782.

[Chem. 2]

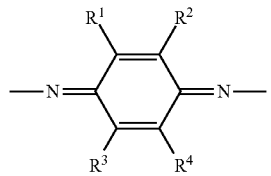

In formula (H1), $R^1$ to $R^6$ are each independently a hydrogen atom, a halogen atom, a nitro group, a cyano group, an amino group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or heteroaryl group of 2 to 20 carbon atoms which may be substituted with $Z^2$, or a —NHY$^1$, —NY$^2$Y$^3$, —OY$^4$ or —SY$^5$ group; $Y^1$ to $Y^5$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; $Z^1$ is a halogen atom, a nitro group, a cyano group, an amino group, or an aryl group of 6 to 20 carbon atoms or heteroaryl group of 2 to 20 carbon atoms which may be substituted with $Z^3$; $Z^2$ is a halogen atom, a nitro group, a cyano group, an amino group, or an alkyl group of 1 to 20 carbon atoms, alkenyl group of 2 to 20 carbon atoms or alkynyl group of 2 to 20 carbon atoms which may be substituted with $Z^3$; $Z^3$ is a halogen atom, a nitro group, a cyano group, or an amino group; and the letters k and l are each independently integers from 1 to 5.

In formula (H2), $R^7$ to $R^{10}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, or an acyl group of 1 to 20 carbon atoms; $R^{11}$ to $R^{14}$ are each independently a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, a imidazolyl group or a thienyl group (which groups may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms), or a group of formula (H4) (provided that at least one of $R^{11}$ to $R^{14}$ is a hydrogen atom); m is an integer from 2 to 5; and $Z^1$ and $Z^2$ are as defined above.

[Chem. 3]

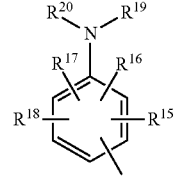

In formula (H4), $R^{15}$ to $R^{18}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, or an acyl group of 1 to 20 carbon atoms; $R^{19}$ and $R^{20}$ are each independently a phenyl group, a naphthyl group, an anthryl group, a pyridyl group, a pyrimidinyl group, a pyridazinyl group, a pyrazinyl group, a furanyl group, a pyrrolyl group, a pyrazolyl group, an imidazolyl group or a thienyl group (which groups may be bonded to each other to form a ring or may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms); and $Z^1$ and $Z^2$ are as defined above.

In formula (H3), $R^{21}$ to $R^{24}$ are each independently a hydrogen atom, a halogen atom, a hydroxyl group, an amino group, a silanol group, a thiol group, a carboxyl group, a sulfonic acid group, a phosphoric acid group, a phosphoric acid ester group, an ester group, a thioester group, an amide group, a nitro group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, an acyl group of 1 to 20 carbon atoms, a sulfonic acid group, or a —NHY$^1$, —NY$^2$Y$^3$, —OY$^4$, —SY$^5$ or —SiY$^6$Y$^7$Y$^8$ group; $Y^1$ to $Y^8$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; X and Y are each independently a thiophene ring which may be substituted with $Z^2$; the two sulfur atoms included on the dithiine ring may be each independently a SO group or a SO$_2$ group; p, q and r are each independently 0 or an integer of 1 or more, these being numbers that together satisfy the condition p+q+r≤20; and $Z^1$ and $Z^2$ are as defined above.

In each of the above formulas, the halogen atom is exemplified by fluorine, chlorine, bromine and iodine atoms.

The alkyl group of 1 to 20 carbon atoms may be linear, branched or cyclic. Illustrative examples include linear or branched alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Illustrative examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Illustrative examples of alkynyl groups of 2 to 20 carbon atoms include ethynyl, n-1-propynyl, n-2-propynyl, n-1-buynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Illustrative examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Illustrative examples of aralkyl groups of 7 to 20 carbon atoms include benzyl, phenylethyl, phenylpropyl, naphthylmethyl, naphthylethyl and naphthylpropyl groups.

Illustrative examples of heteroaryl groups of 2 to 20 carbon atoms include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

Haloalkyl groups of 1 to 20 carbon atoms are exemplified by those in which at least one hydrogen atom on the above-mentioned alkyl groups of 1 to 20 carbon atoms is substituted with a halogen atom. Of these, fluoroalkyl groups are preferred, and perfluoroalkyl groups are more preferred.

Illustrative examples include fluoromethyl, difluoromethyl, trifluoromethyl, pentafluoroethyl, 2,2,2-trifluoroethyl, heptafluoropropyl, 2,2,3,3,3-pentafluoropropyl, 2,2,3,3-tetrafluoropropyl, 2,2,2-trifluoro-1-(trifluoromethyl)ethyl, nonafluorobutyl, 4,4,4-trifluorobutyl, undecafluoropentyl, 2,2,3,3,4,4,5,5,5-nonafluoropentyl, 2,2,3,3,4,4,5,5-octafluoropentyl, tridecafluorohexyl, 2,2,3,3,4,4,5,5,6,6,6-undecafluorohexyl, 2,2,3,3,4,4,5,5,6,6-decafluorohexyl and 3,3,4,4,5,5,6,6,6-nonafluorohexyl groups.

Illustrative examples of alkoxy groups of 1 to 20 carbon atoms include methoxy, ethoxy, n-propoxy, i-propoxy, c-propoxy, n-butoxy, i-butoxy, s-butoxy, t-butoxy, n-pentoxy, n-hexoxy, n-heptyloxy, n-octyloxy, n-nonyloxy, n-decyloxy, n-undecyloxy, n-dodecyloxy, n-tridecyloxy, n-tetradecyloxy, n-pentadecyloxy, n-hexadecyloxy, n-heptadecyloxy, n-octadecyloxy, n-nonadecyloxy and n-eicosanyloxy groups.

Illustrative examples of thioalkoxy (alkylthio) groups of 1 to 20 carbon atoms include methylthio, ethylthio, n-propylthio, isopropylthio, n-butylthio, isobutylthio, s-butylthio, t-butylthio, n-pentylthio, n-hexylthio, n-heptylthio, n-octylthio, n-nonylthio, n-decylthio, n-undecylthio, n-dodecylthio, n-tridecylthio, n-tetradecylthio, n-pentadecylthio, n-hexadecylthio, n-heptadecylthio, n-octadecylthio, n-nonadecylthio and n-eicosanylthio groups.

Illustrative examples of acyl groups of 1 to 20 carbon atoms include formyl, acetyl, propionyl, butyryl, isobutyryl, valeryl, isovaleryl and benzoyl groups.

In formula (H-1), $R^1$ to $R^6$ are preferably hydrogen atoms, halogen atoms, alkyl groups of 1 to 20 carbon atoms which may be substituted with $Z^1$, aryl groups of 6 to 20 carbon atoms which may be substituted with $Z^2$, —$NHY^1$, —$NY^2Y^3$, —$OY^4$ or —$SY^5$. In this case, $Y^1$ to $Y^5$ are preferably alkyl groups of 1 to 10 carbon atoms which may be substituted with $Z^1$ or aryl groups of 6 to 10 carbon atoms which may be substituted with $Z^2$; more preferably alkyl groups of 1 to 6 carbon atoms which may be substituted with $Z^1$ or phenyl groups which may be substituted with $Z^2$; and even more preferably alkyl groups of 1 to 6 carbon atoms or phenyl groups.

In particular, $R^1$ to $R^6$ are more preferably hydrogen atoms, fluorine atoms, methyl groups, phenyl groups or diphenylamino groups (—$NY^2Y^3$ groups in which $Y^2$ and $Y^3$ are phenyl groups). It is even more preferable for $R^1$ to $R^4$ to be hydrogen atoms and for $R^5$ and $R^6$ to be either both hydrogen atoms or both diphenylamino groups.

In particular, in $R^1$ to $R^6$ and $Y^1$ to $Y^5$, $Z^1$ is preferably a halogen atom or an aryl group of 6 to 10 carbon atoms which may be substituted with $Z^3$, more preferably a fluorine atom or a phenyl group, and even more preferably does not exist (i.e., is a non-substituting group); and $Z^2$ is preferably a halogen atom or an alkyl group of 1 to 10 carbon atoms which may be substituted with $Z^3$, more preferably a fluorine atom or an alkyl group of 1 to 6 carbon atoms, and even more preferably does not exist (i.e., is a non-substituting group).

$Z^3$ is preferably a halogen atom, more preferably a fluorine atom, and even more preferably does not exist (i.e., is a non-substituting group).

From the standpoint of increasing the solubility of the aniline derivative of formula (H1), the letters k and l preferably satisfy the condition k+1≤8, and more preferably satisfy the condition k+1≤5.

In formula (H2), $R^7$ to $R^{10}$ are preferably hydrogen atoms, halogen atoms, alkyl groups of 1 to 4 carbon atoms, perfluoroalkyl groups of 1 to 4 carbon atoms, or alkoxy groups of 1 to 4 carbon atoms; and are more preferably hydrogen atoms.

To increase the solubility of the aniline derivative of formula (H2) in solvents and also increase the uniformity of the thin film obtained, $R^{11}$ and $R^{13}$ are preferably both hydrogen atoms.

In particular, it is preferable for $R^{11}$ and $R^{13}$ to both be hydrogen atoms and for $R^{12}$ and $R^{14}$ to each be independently a phenyl group (which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms or an acyl group of 1 to 20 carbon atoms) or a group of above formula (H4); more preferable for $R^{11}$ and $R^{13}$ to both be hydrogen atoms and $R^{12}$ and $R^{14}$ to each be independently a phenyl group or a group of formula (H4') below in which $R^{19'}$ and $R^{20'}$ are both phenyl groups; and even more preferable for $R^{11}$ and $R^{13}$ to both be hydrogen atoms and $R^{12}$ and $R^{14}$ to both be phenyl groups.

Also, based on such considerations as the availability of the compound, ease of preparation and cost, the subscript m is preferably from 2 to 4. To increase the solubility of the compound in solvents, m is more preferably 2 or 3. For a good balance among the compound availability, ease of production, production cost, solubility in solvents and transparency of the resulting thin film, m is most preferably 2.

[Chem. 4]

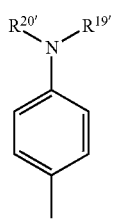

(H4')

In formula (H3), $R^{21}$ to $R^{24}$ are preferably hydrogen atoms, fluorine atoms, sulfonic acid groups, alkyl groups of 1 to 8 carbon atoms, —$OY^4$ groups or —$SiY^6Y^7Y^8$ groups, and more preferably hydrogen atoms.

From the standpoint of increasing the solubility of the compound, the letters p, q and r are preferably each 1 or more, with p+q+r≤20; and are more preferably each 1 or more, with p+q+r≤10. In addition, to achieve a high charge transportability, it is preferable for the letters p, q and r to each be 1 or more, with 5≤p+q+r; and it is more preferable for q to be 1 and for p and r to each be 1 or more, with 5≤p+q+r.

The aniline derivative or thiophene derivative of formulas (H1) to (H3) that is used may be a commercial product or may be a compound synthesized by a known method such as the methods mentioned in the above-cited publications. In either case, it is preferable to use a compound that has been purified by a process such as recrystallization or vapor deposition prior to preparation of the charge-transporting varnish. By using a compound that has been purified, it is possible to further increase the characteristics of organic photoelectric conversion devices having a thin film obtained from this varnish. In the case of purification by recrystallization, the solvent used may be, for example, 1,4-dioxane or tetrahydrofuran.

In the charge-transporting varnish of the invention, a single compound (i.e., for which the molecular weight distribution has a dispersity of 1) selected from compounds of formulas (H1) to (H3) may be used singly, or two or more such compounds may be used in combination, as the charge-transporting substance of formula (H1) to (H3).

In particular, from the standpoint of increasing the transparency of the hole-collecting layer, the use of an aniline derivative of formula (H2) is preferred, the use of a benzidine derivative in which the letter m is 2 is more preferred, and the use of a diphenylbenzidine of formula (g) below is even more preferred.

Examples of charge-transporting substances that may be preferably used in the invention include, but are not limited to, those shown below.

[Chem. 5]

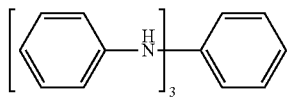

(a)

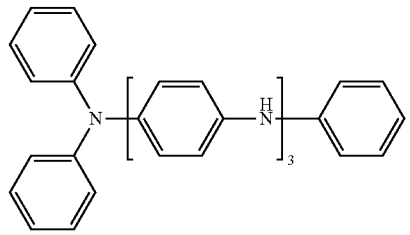

(b)

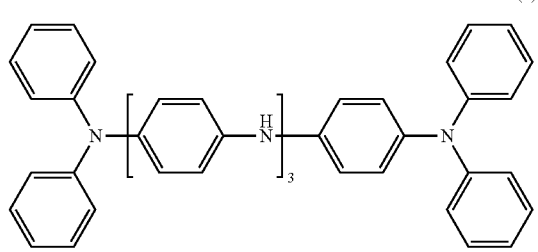

(c)

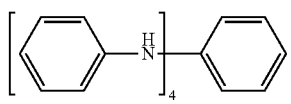

(d)

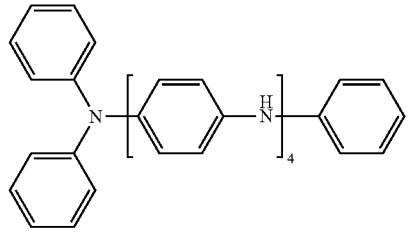

(e)

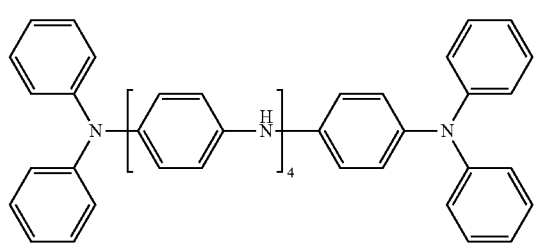

(f)

[Chem. 6]

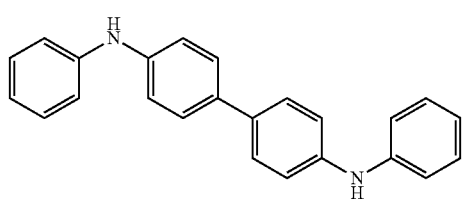

(g)

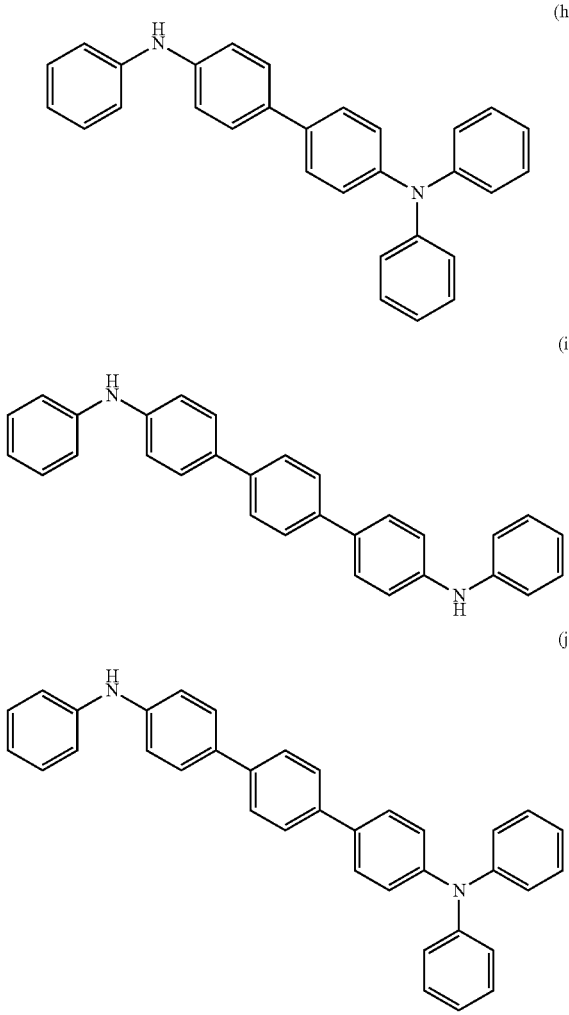

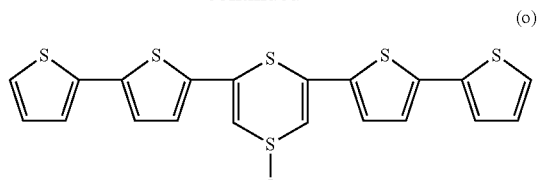

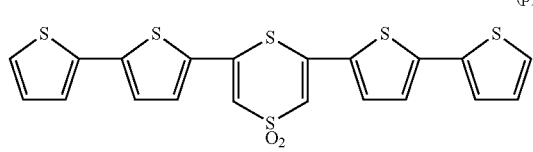

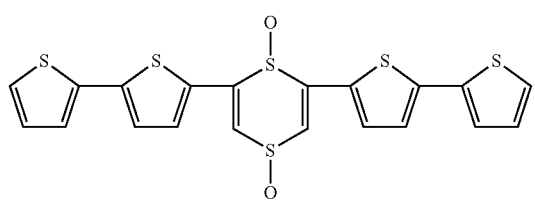

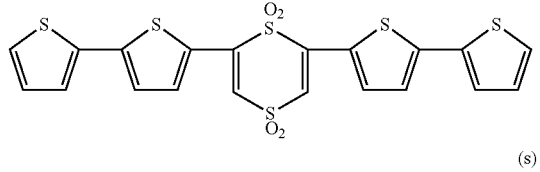

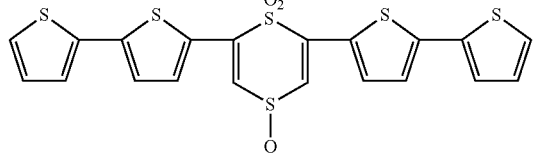

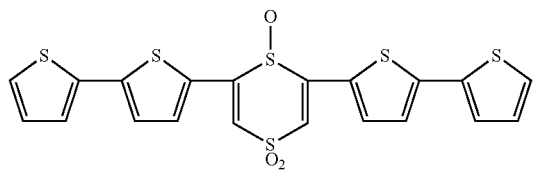

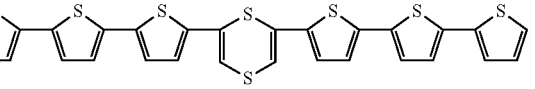

In addition to the above charge-transporting substance, the charge-transporting varnish of the invention includes an electron-accepting dopant substance that includes at least one type of naphthalenepolysulfonic acid selected from among naphthalenedisulfonic acids, naphthalenetrisulfonic acids and naphthalenetetrasulfonic acids.

Specific examples of naphthalenepolysulfonic acids include naphthalenedisulfonic acids such as 1,5-naphthalenedisulfonic acid and 2,7-naphthalenedisulfonic acid; naphthalenetrisulfonic acids such as 1,3,5-naphthalenetrisulfonic acid and 1,3,6-naphthalenetrisulfonic acid; and naphthalenetetrasulfonic acids such as 1,4,5,7-naphthalenetetrasulfonic acid. Of these, naphthalenedisulfonic acids and naphthalenetrisulfonic acids are preferred.

In addition to the above naphthalenepolysulfonic acids, depending on the intended use of the resulting thin film, other electron-accepting dopant substances may be included for such purposes as to increase the photoelectric conversion efficiency of the organic photoelectric conversion device thus obtained.

Such other electron-accepting dopant substances are not particularly limited, so long as they are substances which dissolve in at least one of the solvents used in the charge-transporting varnish.

Specific examples of other electron-accepting dopant substances include strong inorganic acids such as hydrogen chloride, sulfuric acid, nitric acid and phosphoric acid; Lewis acids such as aluminum(III) chloride ($AlCl_3$), titanium(IV) tetrachloride ($TiCl_4$), boron tribromide ($BBr_3$), a boron trifluoride-ether complex ($BF_3 \cdot OEt_2$), iron(III) chloride ($FeCl_3$), copper(II) chloride ($CuCl_2$), antimony(V) pentachloride ($SbCl_5$), arsenic(V) pentafluoride ($AsF_5$), phosphorus pentafluoride ($PF_5$) and tris(4-bromophenyl) aluminum hexachloroantimonate (TBPAH); strong organic acids such as the following arylsulfonic acids: benzenesulfonic acid, tosylic acid, camphorsulfonic acid, hydroxybenzenesulfonic acid, 5-sulfosalicylic acid, dodecylbenzenesulfonic acid, polystyrenesulfonic acids, the 1,4-benzodioxanedisulfonic acid compounds mentioned in WO 2005/000832, the naphthalene- or anthracenesulfonic acid compounds mentioned in WO 2006/025342, and the dinonylnaphthalenesulfonic acid compounds mentioned in JP-A 2005-108828; organic oxidizing agents such as 7,7,8,8-tetracyanoquinodimethane (TCNQ), 2,3-dichloro-5,6-dicyano-1,4-benzoquinone (DDQ), and iodine; and inorganic oxidizing agents such as heteropolyacids (e.g., the phosphomolybdic acid, phosphotungstic acid and phosphotungstomolybdic acid mentioned in WO 2010/058777). These may be used in combination.

High-solvency solvents that are able to dissolve well the above-described charge-transporting substance and electron-accepting dopant substance may be used as the organic solvent employed to prepare the charge-transporting varnish. The high-solvency solvent may be of one type used alone, or two or more may be used in admixture. The amount used may be set to from 5 to 100 wt %, based on the overall solvent using in the varnish.

Illustrative examples of such high-solvency solvents include N-methylformamide, N,N-dimethylformamide, N,N-diethylformamide, N-methylacetamide, N,N-dimethylacetamide, N-methylpyrrolidone and 1,3-dimethyl-2-imidazolidinone.

Of these, the amide-type solvents N-methylformamide, N,N-dimethylformamide, N,N-diethylformamide, N-methylacetamide and N,N-dimethylacetamide are preferred. N,N-dimethylacetamide is more preferred.

The charge-transporting substance and electron-accepting dopant substance are preferably both in a completely dissolved state or a uniformly dispersed state within the organic solvent. To reproducibly obtain a hole-collecting layer that provides an organic photoelectric conversion device having a high photoelectric conversion efficiency, it is more preferable for these substances to be completely dissolved within the organic solvent.

The charge-transporting varnish of the invention preferably includes at least one high-viscosity organic solvent having a viscosity at 25° C. of from 10 to 200 mPa·s, especially from 35 to 150 mPa·s, and a boiling point at standard pressure of from 50 to 300° C., especially from 150 to 250° C.

Examples of high-viscosity organic solvents include, but are not particularly limited to, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

The addition ratio of high-viscosity organic solvent with respect to the overall solvent used in the charge-transporting varnish of the invention is preferably in a range within which the deposition of solids does not occur. An addition ratio of from 5 to 80 wt % is preferred, so long as solids do not deposit out.

In addition, another solvent capable of imparting flatness to the film during heat treatment may also be admixed in a ratio with respect to the overall solvent used in the composition of from 1 to 90 wt %, preferably from 1 to 50 wt %, for such purposes as to increase the ability of the composition to wet the surface to which it is applied, adjust the solvent surface tension, adjust the solvent polarity and adjust the solvent boiling point.

Examples of such solvents include, but are not limited to, butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate and n-hexyl acetate.

In order to increase the electron-blocking properties of the organic photoelectric conversion device obtained, it is desirable for the charge-transporting varnish of the invention to include an organosilane compound.

The organosilane compound is exemplified by trialkoxysilanes and dialkoxysilanes, with aryltrialkoxysilanes, aryldialkoxysilanes, fluorine atom-containing trialkoxysilanes, and fluorine atom-containing dialkoxysilane compounds being preferred, and silane compounds of formula (S1) or (S2) being more preferred.

[Chem. 8]

  (S1)

  (S2)

In these formulas, R is a fluoroalkyl group of 1 to 6 carbon atoms.

Specific examples of fluoroalkyl groups of 1 to 6 carbon atoms include trifluoromethyl, 2,2,2-trifluoroethyl, 1,1,2,2,2-pentafluoroethyl, 3,3,3-trifluoropropyl, 2,2,3,3,3-pentafluoropropyl, 1,1,2,2,3,3,3-heptafluoropropyl, 4,4,4-trifluorobutyl, 3,3,4,4,4-pentafluorobutyl, 2,2,3,3,4,4,4-heptafluorobutyl and 1,1,2,2,3,3,4,4,4-nonafluorobutyl groups.

Specific examples of dialkoxysiloxane compounds include dimethyldimethoxysilane, dimethyldiethoxysilane, methylethyldimethoxysilane, diethyldimethoxysilane, diethyldiethoxysilane, methylpropyldimethoxysilane, methylpropyldiethoxysilane, diisopropyldimethoxysilane, phenylmethyldimethoxysilane, vinylmethyldimethoxysilane, 3-glycidoxypropylmethyldimethoxysilane, 3-glycidoxypropylmethyldiethoxysilane, 3-(3,4-epoxycyclohexyl)ethylmethyldimethoxysilane, 3-methacryloxypropylmethyldimethoxysilane, 3-methacryloxypropylmethyldiethoxysilane, 3-mercaptopropylmethyldimethoxysilane, γ-aminopropylmethyldiethoxysilane, N-(2-aminoethyl)aminopropylmethyldimethoxysilane and 3,3,3-trifluoropropylmethyldimethoxysilane.

Specific examples of trialkoxysilane compounds include methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, heptyltrimethoxysilane, heptyltriethoxysilane, octyltrimethoxysilane, octyltriethoxysilane, dodecyltrimethoxysilane, dodecyltriethoxysilane, hexadecyltrimethoxysilane, hexadecyltriethoxysilane, octadecyltrimethoxysilane, octadecyltriethoxysilane, phenyltrimethoxysilane, phenyltriethoxysilane, vinyltrimethoxysilane, vinyltriethoxysilane, γ-aminopropyltrimethoxysilane, 3-aminopropyltriethoxysilane, γ-glycidoxypropyltrimethoxysilane, 3-glycidoxypropyltriethoxysilane, γ-methacryloxypropyltrimethoxysilane, γ-methacryloxypropyltriethoxysilane, triethoxy(4-trifluoromethyl)phenyl)silane, dodecyltriethoxysilane, 3,3,3-trifluoropropyltrimethoxysilane, (triethoxysilyl)cyclohexane, perfluorooctylethyltriethoxysilane, triethoxyfluorosilane, tridecafluoro-1,1,2,2-tetrahydrooctyltriethoxysilane, 3-(heptafluoroisopropoxy)propyltriethoxysilane, heptadecafluoro-1,1,2,2-tetrahydrodecyltriethoxysilane, triethoxy-2-thienylsilane and 3-(triethoxysilyl)furan.

When an organosilane compound is used, the content thereof, based on the charge-transporting substance and the electron-accepting dopant substance in the charge-transporting varnish of the invention, is generally from about 0.1 to about 200 wt %, preferably from 1 to 100 wt %, and more preferably from 5 to 50 wt %.

The solids concentration of the inventive charge-transporting varnish, which is suitably set while taking into account the viscosity, surface tension and other properties of the varnish and the thickness and other properties of the thin film to be produced, is generally from about 0.1 to about 10.0 wt %, preferably from 0.5 to 5.0 wt %, and more preferably from 1.0 to 3.0 wt %.

As used herein, "solids" refers to the ingredients other than the organic solvent which make up the charge-transporting varnish.

The molar ratio between the charge-transporting substance and the electron-accepting dopant substance, which is suitably set while taking into account such factors as the charge transportability to be achieved and the type of charge transporting substance, is generally from 0.1 to 10, preferably from 0.2 to 5.0, and more preferably from 0.5 to 3.0, of the electron-accepting dopant substance relative to unity (1) for the charge-transporting substance.

The viscosity of the charge-transporting varnish used in the invention, which is suitably adjusted according to the coating method while taking into account the thickness and other properties of the thin film to be formed and the solids concentration of the varnish, is generally from about 0.1 to about 50 mPa·s at 25° C.

When preparing the charge-transporting varnish of the invention, the charge-transporting substance, electron-accepting dopant substance and organic solvent can be mixed together in any order, provided that the solids uniformly dissolve or disperse in the solvent. That is, so long as the solids uniformly dissolve or disperse in the organic solvent, any of the following methods may be used: the method of dissolving the charge-transporting substance in the organic solvent, and then dissolving the electron-accepting dopant substance in the resulting solution; the method of dissolving the electron-accepting dopant substance in the organic solvent, and then dissolving the charge-transporting substance in the resulting solution; and the method of mixing together the charge-transporting substance and the electron-accepting dopant substance, and then poring the mixture into and dissolving it within the organic solvent.

Preparation of the charge-transporting varnish is generally carried out in an inert gas atmosphere at standard temperature and pressure, although it may be carried out in an open-air atmosphere (in the presence of oxygen) or may be carried out under heating, provided that the compounds within the varnish do not decompose and the composition does not undergo any large change in makeup.

The hole-collecting layer of the invention can be formed by coating the above-described charge-transporting varnish onto the anode of an organic photoelectric conversion device and baking the applied varnish.

During coating, the optimal technique from among various types of wet processes such as drop casting, spin coating, blade coating, dip coating, roll coating, bar coating, die coating, inkjet coating and printing methods (e.g., relief printing, intaglio printing, lithography, screen printing) may be used while taking into account such factors as the viscosity and surface tension of the varnish and the desired thickness of the thin film.

Coating is generally carried out in an inert gas atmosphere at standard temperature and pressure, although it may be carried out in an open-air atmosphere (in the presence of oxygen) or may be carried out under heating, provided that the compounds within the varnish do not decompose and the composition does not undergo any large change in makeup.

The film thickness is generally from about 1 to about 200 nm, preferably from about 3 to about 100 nm, and more preferably from 5 to 30 nm. Methods for changing the film thickness include methods that involve changing the solids concentration within the varnish and methods that involve changing the amount of solution applied during coating.

A method for producing an organic photoelectric conversion device using the charge-transporting varnish of the invention is described below.

[Formation of Anode Layer]:
Step of Producing Transparent Electrode by Forming Anode Material Layer on Surface of Transparent Substrate A metal oxide such as indium-tin oxide (ITO) or indium-zinc oxide (IZO), or an organic compound having a high charge transportability, such as a polythiophene derivative or a polyaniline derivative, may be used as the anode material. A substrate made of glass or a clear resin may be used as the transparent substrate.

The method of forming the anode material layer (anode layer) is suitably selected according to the nature of the anode material. Generally, either a dry process that uses a sublimable compound (vapor deposition) or a wet process that uses a charge-transporting compound-containing varnish (particularly spin coating or slit coating) is employed.

Commercial products also may be suitably used as the transparent electrode. In this case, from the standpoint of increasing the device yield, the use of a substrate that has been subjected to leveling treatment is preferred. When a commercial product is used, the method of manufacturing the organic photoelectric conversion device of the invention does not include an anode layer-forming step.

The transparent electrode is preferably used after being cleaned with, for example, a cleaning agent, alcohol or pure water. For example, anode substrates are preferably subjected to surface treatment such as UV/ozone treatment or oxygen-plasma treatment just prior to use. However, surface treatment need not be carried out if the anode material is composed primarily of organic substances.

[Formation of Hole-Collecting Layer]:
Step of Forming Hole-Collecting Layer on Layer of Anode Material Using the charge-transporting varnish of the invention, a hole-collecting layer is formed on the anode material layer in accordance with the above-described method.

[Formation of Active Layer]:

Step of Forming Active Layer on Hole-Collecting Layer

The active layer may be a layer obtained by stacking an n layer which is a thin film consisting of an n-type semiconductor material and a p layer which is a thin film consisting of a p-type semiconductor material, or may be a non-stacked thin film consisting of a mixture of these materials.

Illustrative examples of n-type semiconductor materials include fullerenes, [6,6]-phenyl-$C_{61}$-butyric acid methyl ester ($PC_{61}BM$) and [6,6]-phenyl-$C_{71}$-butyric acid methyl ester ($PC_{71}BM$). Illustrative examples of p-type semiconductor materials include regioregular-poly(3-hexylthiophene) (P3HT), PTB7, PDTP-DFBT, polymers having a thiophene skeleton on the main chain, including thienothiophene unit-containing polymers such as those mentioned in JP-A 2009-158921 and WO 2010/008672, phthalocyanines such as CuPC and ZnPC, and porphyrins such as tetrabenzoporphyrin.

Of these, $PC_{61}BM$ and $PC_{71}BM$ are preferred as the n-type material, and polymers having a thiophene skeleton on the main chain, such as PTB7, are preferred as the p-type material.

As used herein, "thiophene skeleton on the main chain" refers to divalent aromatic rings consisting entirely of thiophene, or divalent condensed aromatic rings containing one or more thiophene, such as thienothophene, benzothiophene, dibenzothiophene, benzodithiophene, naphthothiophene, naphthodithiophene, anthrathiophene and anthradithiophene. These may be substituted with the substituents represented by $R^1$ to $R^6$ above.

The method of forming the active layer is suitably selected according to the nature of the n-type semiconductor or p-type semiconductor material. A dry process that uses a sublimable compound (especially vapor deposition) or a wet process that uses a semiconductor material-containing varnish (especially spin coating or slit coating) is generally employed.

[Chem. 9]

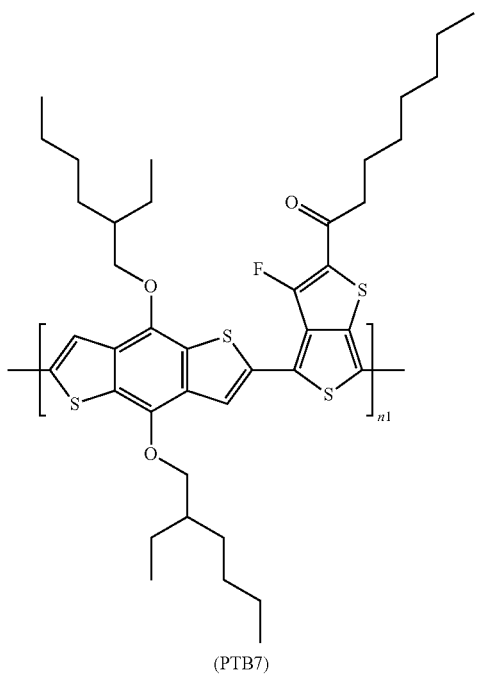

(PTB7)

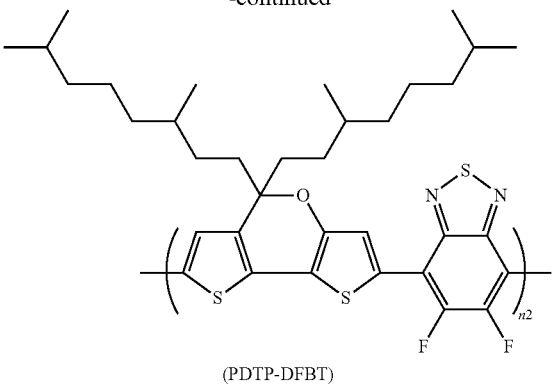

(PDTP-DFBT)

In the above formulas, n1 and n2 are positive integers which indicate the number of repeating units.

[Formation of Electron-Collecting Layer]:

Step of Forming an Electron-Collecting Layer on Active Layer

Where necessary, an electron-collecting layer may be formed between the active layer and the cathode layer.

Illustrative examples of electron-collecting layer-forming materials include lithium oxide ($Li_2O$), magnesium oxide (MgO), alumina ($Al_2O_3$), lithium fluoride (LiF), magnesium fluoride ($MgF_2$) and strontium fluoride ($SrF_2$).

The method of forming the electron-collecting layer is suitably selected according to the nature of the electron-collecting layer-forming material. A dry process that uses a sublimable compound (especially vapor deposition) or a wet process that uses a varnish containing the electron-collecting layer-forming material (especially spin coating or slit coating) is generally employed.

[Formation of Cathode Layer]:

Step of Forming Cathode Layer on Electron-Collecting Layer

Illustrative examples of cathode materials include aluminum, magnesium-silver alloys, aluminum-lithium alloys, lithium, sodium, potassium, cesium, calcium, barium, silver and gold. A plurality of cathode materials may be used by being stacked as multiple layers or mixed together.

The method of forming the cathode layer is suitably selected according to the nature of the material, although a dry process (especially vapor deposition) is typically used.

[Formation of Carrier Block Layers]

Where necessary, carrier block layers may be provided to desired layer intervals for such purposes as to control the rectifiability of the photoelectric current.

Examples of materials that form the carrier block layers include titanium oxide and zinc oxide.

The method of forming a carrier block layer is suitably selected according to the nature of the material. Vapor deposition is generally employed in cases where a sublimable compound is used, and spin coating or slit coating is generally employed when a varnish in which the material has been dissolved is used.

Organic photoelectric conversion devices manufactured by the exemplary method described above, to prevent their deterioration from exposure to the atmosphere, can again be placed in a glovebox and subjected to a sealing operation under a nitrogen or other inert gas atmosphere and, in the sealed state, made to function as organic photoelectric conversion devices and measurement of the device characteristics carried out.

Examples of the sealing method include a method that involves bonding a glass substrate having a UV-curable resin attached at the edge to the film-forming side of an organic photoelectric conversion device and curing the resin by UV irradiation, all in an inert gas atmosphere, and a method in which film-type sealing is carried out in a vacuum by a technique such as sputtering.

EXAMPLES

Working Examples and Comparative Examples are given below to more concretely illustrate the invention, although the invention is not limited by these Examples. The equipment used was as follows.
(1) Glovebox: A glovebox system available from Vacuum Atmospheres Company (USA)
(2) Vapor Deposition System:
A vapor deposition system from Aoyama Engineering KK
(3) Measurement System:
ET-4000A fully automated microfigure measuring instrument, from Kosaka Laboratory, Ltd.
(4) Apparatus Used for Measuring Current Values:
4156C Precision Semiconductor Parameter Analyzer, from Agilent KK
(5) Light Source Apparatus Used for Measuring Photoelectric Current:
SM-250 Hyper Monolight System, from Bunkoukeiki Co., Ltd.

[1] Preparation of Active Layer-Forming Composition

Preparation Example 1

Chlorobenzene (2.0 mL) was added to a sample vial containing 20 mg of PTB7 (available from 1-Material) and 30 mg of PCBM (available from Frontier Carbon Corporation under the product name "nanom spectra E100"), and the vial contents were stirred for 15 hours on a hot plate set to 80° C. The resulting solution was then allowed to cool to room temperature, following which 60 μL of 1,8-diiodooctane (Tokyo Chemical Industry Co., Ltd.) was added and stirring was carried out, giving Active Layer-Forming Composition A1.

[2] Preparation of Charge-Transporting Varnish

Working Example 1-1

N,N-Dimethylacetamide (DMAc), 12.5 g, was added to a mixture of 322.5 mg (0.959 mmol) of N,N'-diphenylbenzidine of formula [1] (from Tokyo Chemical Industry Co., Ltd.; the same applies below) and 188.3 mg (0.511 mmol) of 1,3,6-naphthalenetrisulfonic acid of formula [2] (Tomiyama Pure Chemical Industries, Ltd.), and dissolved under stirring while being ultrasonically irradiated at room temperature. To this was added 12.5 g of cyclohexanol (CHN) and stirring was carried out, giving a brown solution.
The brown solution thus obtained was filtered with a syringe filter having a pore size of 0.2 μm, giving Charge-Transporting Varnish B1.

[Chem. 10]

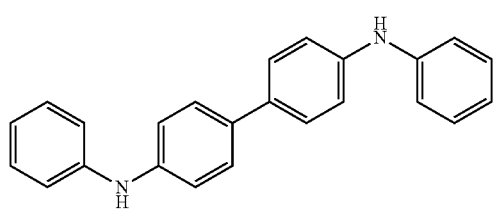

[1]

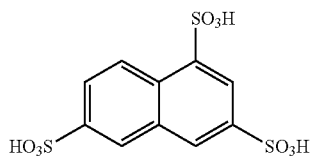

[2]

Working Example 1-2

DMAc, 2.5 g, was added to a mixture of 60.5 mg (0.180 mmol) of N,N'-diphenylbenzidine and 41.5 mg (0.144 mmol) of 1,5-naphthalenedisulfonic acid of formula [3] (Tokyo Chemical Industry Co., Ltd.), and dissolved under stirring while being ultrasonically irradiated at room temperature. To this was added 2.5 g of CHN and stirring was carried out, giving a brown solution.
The brown solution thus obtained was filtered with a syringe filter having a pore size of 0.2 μm, giving Charge-Transporting Varnish B2.

[Chem. 11]

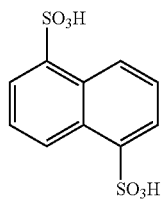

[3]

Comparative Example 1-1

DMAc, 2.5 g, was added to a mixture of 51.3 mg (0.153 mmol) of N,N'-diphenylbenzidine and 50.8 mg (0.244 mmol) of 2-naphthalenesulfonic acid of formula [4] (Tokyo Chemical Industry Co., Ltd.), and dissolved under stirring while being ultrasonically irradiated at room temperature. To this was added 2.5 g of CHN and stirring was carried out, giving a brown solution.
The brown solution thus obtained was filtered with a syringe filter having a pore size of 0.2 μm, giving Charge-Transporting Varnish C1.

[Chem. 12]

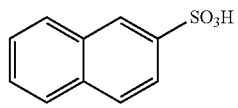

[4]

Comparative Example 1-2

DMAc, 2.5 g, was added to a mixture of 58.3 mg (0.173 mmol) of N,N'-diphenylbenzidine and 43.9 mg (0.277 mmol) of benzenesulfonic acid of formula [5] (Tokyo Chemical Industry Co., Ltd.), and dissolved under stirring while being ultrasonically irradiated at room temperature. To this was added 2.5 g of CHN and stirring was carried out, giving a brown solution.

The brown solution thus obtained was filtered with a syringe filter having a pore size of 0.2 μm, giving Charge-Transporting Varnish C2.

[Chem. 13]

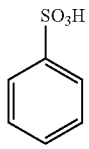

[5]

[3] Production of Hole-Collecting Layer and Organic Photoelectric Conversion Device Working Example 2-1

A 20 mm×20 mm glass substrate patterned thereon with, as the positive electrode, an ITO transparent conductive layer in the form of 2 mm×20 mm stripes was subjected to 15 minutes of UV/ozone treatment, following which Charge-Transporting Varnish B1 obtained in Working Example 1-1 was spin-coated onto the substrate. This glass substrate was heated on a hot plate at 50° C. for 5 minutes, and additionally at 230° C. for 20 minutes, thereby forming a hole-collecting layer.

Within a glovebox purged with inert gas, film formation was subsequently carried out by the dropwise addition of Active Layer-Forming Composition A1 obtained in Preparation Example 1 to the resulting hole-collecting layer and spin coating.

Next, the substrate on which an organic semiconductor layer had been formed and a negative electrode mask were placed within a vacuum vapor deposition system, the interior of the system was evacuated to a vacuum of $1 \times 10^{-3}$ Pa or below, and an aluminum layer was vapor deposited as the negative electrode to a thickness of 80 nm by a resistance heating method.

Last of all, 10 minutes of heating at 80° C. was carried out on a hot plate, thereby producing an OPV device in which the regions where the striped ITO layer and the aluminum layer intersect have surface areas of 2 mm×2 mm.

Working Example 2-2

Aside from using Charge-Transporting Varnish B2 instead of Charge-Transporting Varnish B1, an OPV device was produced in the same way as in Working Example 2-1.

Comparative Example 2-1

Aside from using Charge-Transporting Varnish C1 instead of Charge-Transporting Varnish B1, an OPV device was produced in the same way as in Working Example 2-1.

Comparative Example 2-2

Aside from using Charge-Transporting Varnish C2 instead of Charge-Transporting Varnish B1, an OPV device was produced in the same way as in Working Example 2-1.

[5] Evaluation of Properties

The short-circuit current density Jsc (mA/cm$^2$), the open-circuit voltage Voc (V), the fill factor FF and the photoelectric conversion efficiency PCE (%) of the respective OPV devices produced as described above were evaluated. The results are shown in Table 1. The photoelectric conversion efficiency was computed as follows.

PCE (%)=Jsc(mA/cm$^2$)×Voc($V$)×FF÷incident light intensity(100(mW/cm$^2$))×100

TABLE 1

| | $J_{sc}$ (mA/cm$^2$) | $V_{oc}$ (V) | FF | PCE (%) | Hole-collecting layer thickness (nm) |
|---|---|---|---|---|---|
| Working Example 2-1 | 11.5 | 0.68 | 0.55 | 4.3 | <5 |
| Working Example 2-2 | 11.6 | 0.72 | 0.56 | 4.8 | <5 |
| Comparative Example 2-1 | 11.2 | 0.53 | 0.48 | 2.8 | <5 |
| Comparative Example 2-2 | 10.9 | 0.48 | 0.46 | 2.4 | <5 |

As shown in Table 1, OPV devices having a charge-transporting thin film produced from a varnish containing a naphthalenetrisulfonic acid (Working Example 2-1) or a naphthalenedisulfonic acid (Working Example 2-2) as the electron-accepting dopant substance exhibit higher conversion efficiencies than OPV devices having a charge-transporting thin film produced from a varnish that uses naphthalenemonosulfonic acid (Comparative Example 2-1) or benzenesulfonic acid (Comparative Example 2-2) as the electron-accepting dopant substance.

The invention claimed is:

1. A charge-transporting varnish comprising a charge-transporting substance, an electron-accepting dopant substance and an organic solvent, wherein the electron-accepting dopant substance includes at least one compound selected from the group consisting of 1,5-naphthalenedisulfonic acid, 2,7-naphthalenedisulfonic acid, 1,3,5-naphthalenetrisulfonic acid, 1,3,6-naphthalenetrisulfonic acid; and 1,4,5,7-naphthalenetetrasulfonic acid, and
   wherein the charge-transporting substance is a charge-transporting substance having a molecular weight of from 200 to 2,000.

2. A charge-transporting varnish comprising a charge-transporting substance, an electron-accepting dopant substance and an organic solvent, wherein the electron-accepting dopant substance includes at least one compound selected from the group consisting of 1,5-naphthalenedisulfonic acid, 2,7-naphthalenedisulfonic acid, 1,3,5-naphthalenetrisulfonic acid, 1,3,6-naphthalenetrisulfonic acid; and 1,4,5,7-naphthalenetetrasulfonic acid, wherein the charge-transporting substance is at least one selected from the group consisting of aniline derivatives and thiophene derivatives of formulas (H2) to (H3) below,

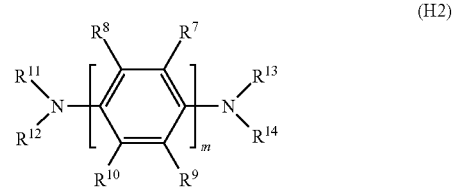

(H2)

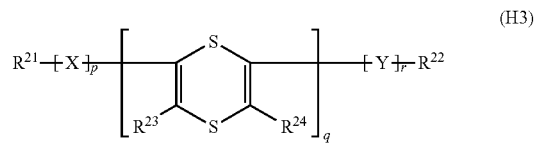

(H3)

in formula (H2), $R^7$ to $R^{10}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, or an acyl group of 1 to 20 carbon atoms; $R^{11}$ to $R^{14}$ are each independently a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, a imidazolyl group or a thienyl group, which groups may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms, or a group of formula (H4), provided that at least one of $R^{11}$ to $R^{14}$ is a hydrogen atom; m is an integer from 2 to 5; and $Z^1$ is a halogen atom, a nitro group, a cyano group, an amino group, or an aryl group of 6 to 20 carbon atoms or heteroaryl group of 2 to 20 carbon atoms which may be substituted with $Z^3$; $Z^2$ is a halogen atom, a nitro group, a cyano group, an amino group, or an alkyl group of 1 to 20 carbon atoms, alkenyl group of 2 to 20 carbon atoms or alkynyl group of 2 to 20 carbon atoms which may be substituted with $Z^3$; $Z^3$ is a halogen atom, a nitro group, a cyano group, or an amino group,

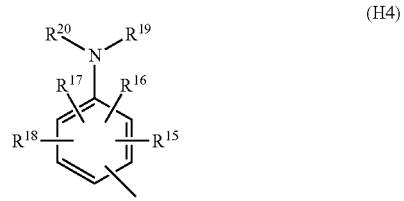

(H4)

in formula (H4), $R^{15}$ to $R^{18}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbon atoms, thioalkoxy group of 1 to 20 carbon atoms, alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, or an acyl group of 1 to 20 carbon atoms; $R^{19}$ and $R^{20}$ are each independently a phenyl group, a naphthyl group, an anthryl group, a pyridyl group, a pyrimidinyl group, a pyridazinyl group, a pyrazinyl group, a furanyl group, a pyrrolyl group, a pyrazolyl group, an imidazolyl group or a thienyl group, which groups may be bonded to each other to form a ring or may be substituted with a halogen atom, a nitro group, a cyano group, a hydroxyl group, a thiol group, a phosphoric acid group, a sulfonic acid group, a carboxyl group, an alkoxy group of 1 to 20 carbon atoms, a thioalkoxy group of 1 to 20 carbon atoms, an alkyl group of 1 to 20 carbon atoms, a haloalkyl group of 1 to 20 carbon atoms, an alkenyl group of 2 to 20 carbon atoms, an alkynyl group of 2 to 20 carbon atoms, an aryl group of 6 to 20 carbon atoms, an aralkyl group of 7 to 20 carbon atoms, or an acyl group of 1 to 20 carbon atoms; and $Z^1$ and $Z^2$ are as defined above, in formula (H3), $R^{21}$ to $R^{24}$ are each independently a hydrogen atom, a halogen atom, a hydroxyl group, an amino group, a silanol group, a thiol group, a carboxyl group, a sulfonic acid group, a phosphoric acid group, a phosphoric acid ester group, an ester group, a thioester group, an amide group, a nitro group, an alkyl group of 1 to 20 carbon atoms, alkenyl group of 2 to 20 carbon atoms or alkynyl group of 2 to 20 carbon atoms which may be substituted with $Z^1$, an aryl group of 6 to 20 carbon atoms or aralkyl group of 7 to 20 carbon atoms which may be substituted with $Z^2$, an acyl group of 1 to 20 carbon atoms, a sulfonic acid group, or a —NHY$^1$, —NY$^2$Y$^3$, —OY$^4$, —SY$^5$ or —SiY$^6$Y$^7$Y$^8$ group; Y$^1$ to Y$^8$ are each independently an alkyl group of 1 to 20 carbon atoms, alkenyl group of 2 to 20 carbon atoms or alkynyl group of 2 to 20 carbon atoms which may be substituted with $Z^1$, or an aryl group of 6 to 20 carbon atoms or heteroaryl group of 2 to 20 carbon atoms which may be substituted with $Z^2$; X and Y are each independently a thiophene ring which may be substituted with $Z^2$; the two sulfur atoms included on the dithiine ring may be each independently a SO group or a SO$_2$ group; p, q and r are each independently 0 or an integer of 1 or more, these being numbers that together satisfy the condition p+q+r≤20; and $Z^1$ and $Z^2$ are as defined above.

3. The charge-transporting varnish of claim 2, wherein the electron-accepting dopant substance includes at least one compound selected from the group consisting of 1,5-naphthalenedisulfonic acid, 2,7-naphthalenedisulfonic acid, 1,3,5-naphthalenetrisulfonic acid and 1,3,6-naphthalenetrisulfonic acid.

4. The charge-transporting varnish of claim 2 or 3, wherein the charge-transporting substance is a charge-transporting substance having a molecular weight of from 200 to 2,000.

5. The charge-transporting varnish of claim 2 which is for use in forming a hole-collecting layer for an organic photoelectric conversion device.

6. The charge-transporting varnish of claim 5, wherein the organic photoelectric conversion device is an organic thin-film solar cell or a photosensor.

7. A hole-collecting layer produced from the charge-transporting varnish of claim 5.

8. An organic photoelectric conversion device comprising the hole-collecting layer of claim 7 and an active layer provided so as to be in contact therewith.

9. The organic photoelectric conversion device of claim 8, wherein the active layer includes a fullerene derivative.

10. The organic photoelectric conversion device of claim 8, wherein the active layer includes a polymer having a thiophene skeleton on the main chain.

11. The organic photoelectric conversion device of claim 8, wherein the active layer includes a fullerene derivative and a polymer having a thiophene skeleton on the main chain.

12. The organic photoelectric conversion device of any one of claims 8 to 11 which is an organic thin-film solar cell.

13. The organic photoelectric conversion device of any one of claims 8 to 11 which is a photosensor.

14. A charge-transporting thin film produced from the charge-transporting varnish of claim 2.

* * * * *